(12) United States Patent
Chae et al.

(10) Patent No.: US 7,511,312 B2
(45) Date of Patent: Mar. 31, 2009

(54) SURFACE MOUNTING DEVICE-TYPE LIGHT EMITTING DIODE

(75) Inventors: Joon Seok Chae, Seongnam-Si (KR); Jong Hwan Baek, Seoul (KR)

(73) Assignee: Samsung Electro-Mechanics Co., Ltd., Suwon-Si, Gyunggi-Do (KR)

( * ) Notice: Subject to any disclaimer, the term of this patent is extended or adjusted under 35 U.S.C. 154(b) by 0 days.

(21) Appl. No.: 11/697,638

(22) Filed: Apr. 6, 2007

(65) Prior Publication Data
US 2008/0023714 A1   Jan. 31, 2008

(30) Foreign Application Priority Data
Jul. 27, 2006   (KR) .................. 10-2006-0070622

(51) Int. Cl.
*H01L 29/74* (2006.01)
(52) U.S. Cl. .......................... 257/98; 257/99
(58) Field of Classification Search ................ 257/98, 257/99
See application file for complete search history.

(56) References Cited
U.S. PATENT DOCUMENTS
6,580,097 B1 *  6/2003  Soules et al. ............. 257/100
7,224,000 B2 *  5/2007  Aanegola et al. ............ 257/98

FOREIGN PATENT DOCUMENTS
| JP | 2001-156338 A | 6/2001 |
| JP | 2002-289926 A | 10/2002 |
| JP | 2005-159045 A | 6/2005 |
| JP | 2006-190723 A | 7/2006 |

OTHER PUBLICATIONS
Korean Intellectual Property Office, Notice of Allowance issued Jul. 30, 2008.

* cited by examiner

*Primary Examiner*—Douglas M Menz
(74) *Attorney, Agent, or Firm*—Lowe Hauptman Ham & Berner

(57) ABSTRACT

A surface mounting device-type light emitting diode (SMD-type LED) comprises a package housing one or more pairs of electrodes therein, the package having a predetermined space in the center thereof and a light-emission window which is opened so that light is emitted through the light-emission window; a lens formed on the package so as to cover the light-emission window; an LED chip formed on an electrode inside the package; a wire for electrically connecting the LED chip and the electrode; and a phosphor-mixed layer formed on the surface of the lens adjacent to the light-emission window.

8 Claims, 3 Drawing Sheets

[FIG. 1]
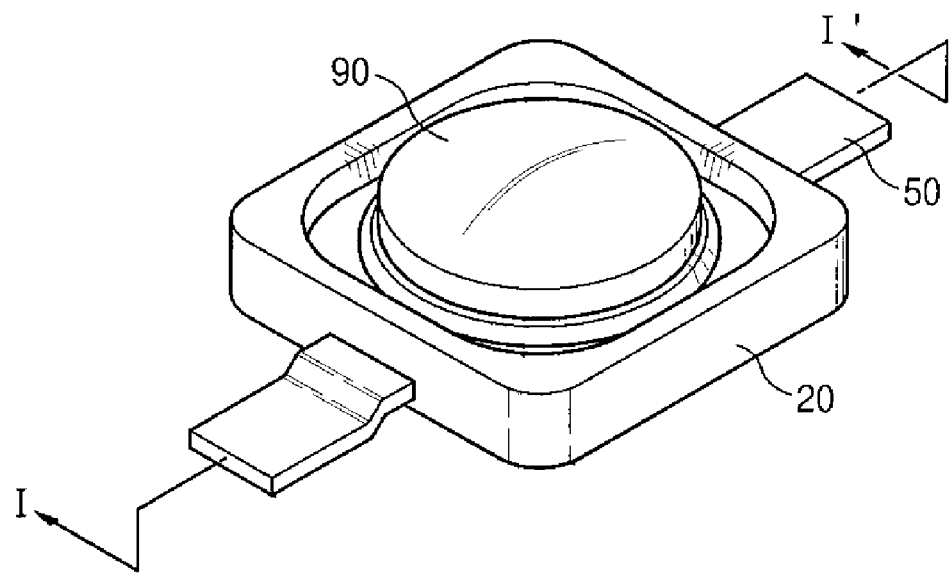
- Prior Art -
[FIG. 2]
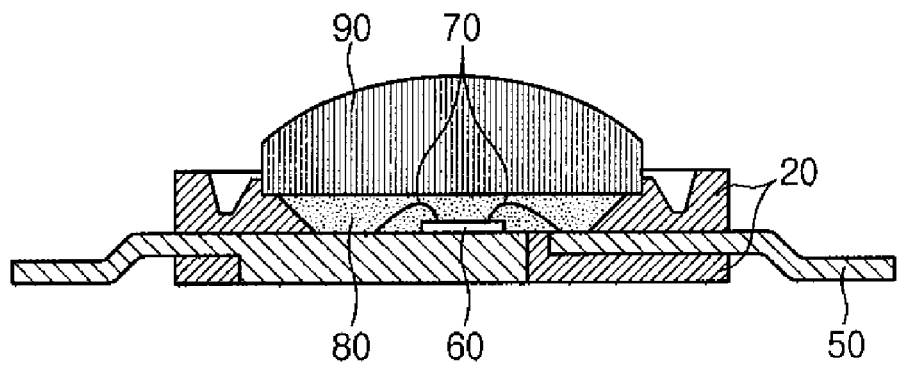
- Prior Art -
[FIG. 3]
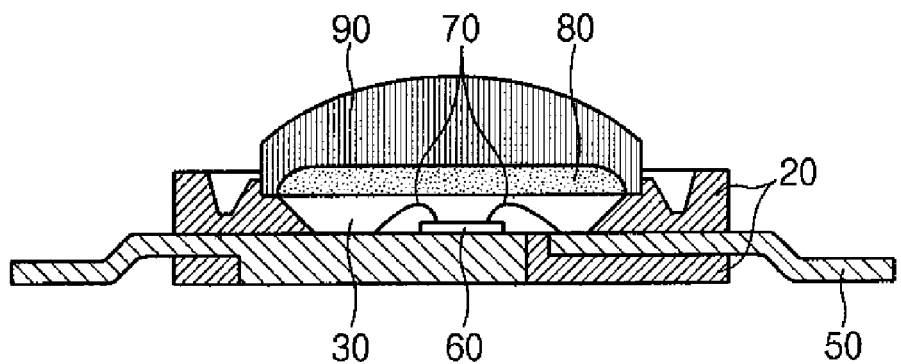

[FIG. 1]
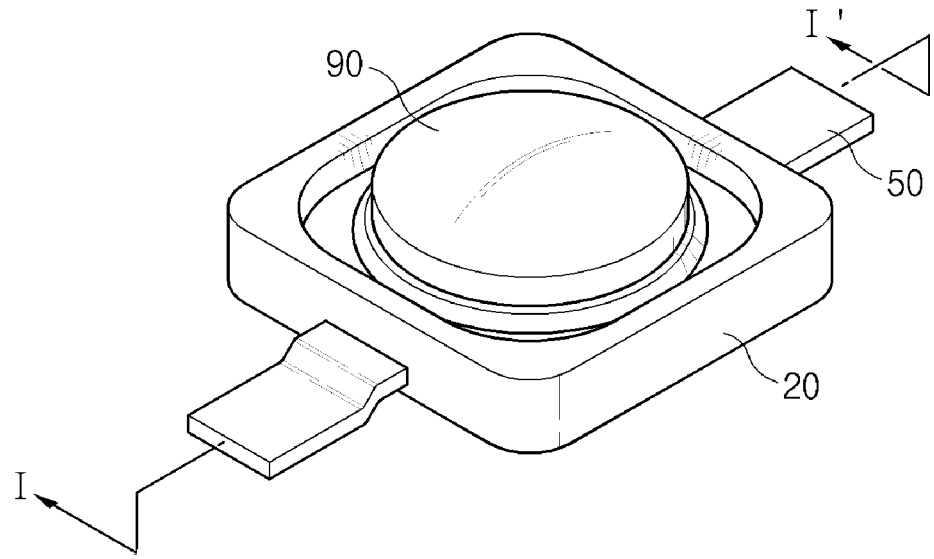
[FIG. 2]
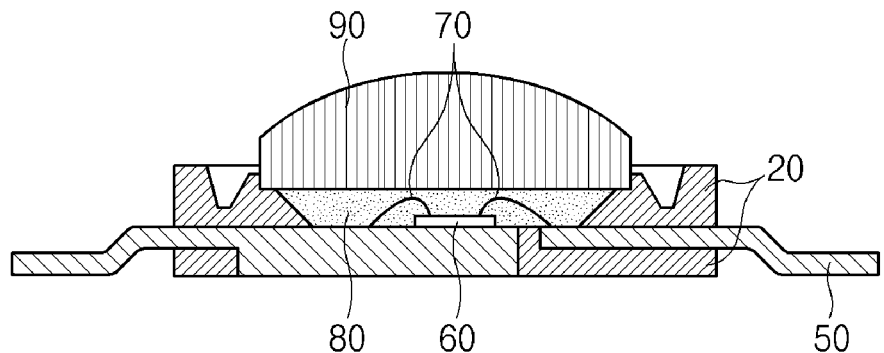
[FIG. 3]
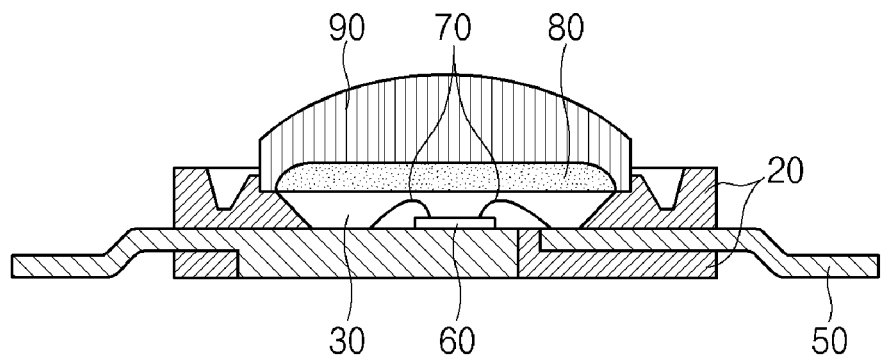
[FIG. 4]
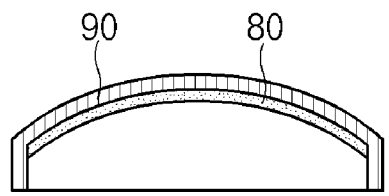

[FIG. 5]
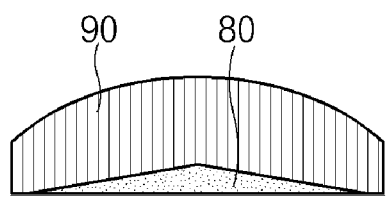
[FIG. 6]
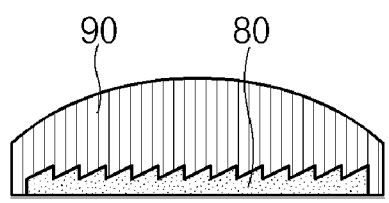
[FIG. 7]
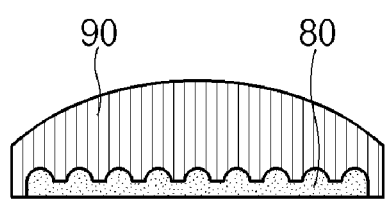
[FIG. 8]
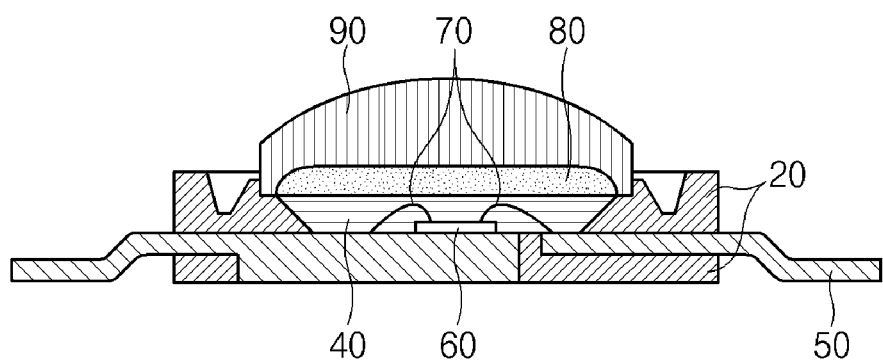

SURFACE MOUNTING DEVICE-TYPE LIGHT EMITTING DIODE

CROSS-REFERENCE TO RELATED APPLICATIONS

This application claims the benefit of Korean Patent Application No. 10-2006-0070622 filed with the Korean Intellectual Property Office on Jul. 27, 2006, the disclosure of which is incorporated herein by reference.

BACKGROUND OF THE INVENTION

1. Field of the Invention

The present invention relates to a surface mounting device-type light emitting diode (hereinafter, referred to as an SMD-type LED) which maximizes efficiency of phosphor such that extraction efficiency of light to be emitted into a lens can be enhanced.

2. Description of the Related Art

Generally, a light emitting diode (hereinafter, referred to as 'LED') has light sources provided by varying compound semiconductor materials such as GaAs, AlGaAs, GaN, InGaInP and the like, thereby implementing various colors of light.

Recently, as the semiconductor technology rapidly develops, the production of LEDs with high luminance and high quality has become possible. Further, as the implementing of blue and white diodes with an excellent characteristic is realized, the use of LED is expanded into display devices, next-generation lighting sources and the like. For example, SMD-type LEDs are productized.

Now, a conventional SMD-type LED will be described in detail with reference to FIGS. 1 and 2.

FIG. 1 is a schematic view illustrating the structure of a general SMD-type LED. The SMD-type LED includes a package 20 formed of molding epoxy resin or the like. On a predetermined surface of the package 20, a light-emission window is opened so that light is easily emitted therethrough. On the light-emission window, a lens 90 having a convex upper surface is formed. On another surface of the package 20, a portion of a lead frame 50 is formed to project, the lead frame 50 being composed of one or more pairs of lead electrodes. The lead frame 50 is mounted on external circuits such as a printed circuit board and the like. Further, inside the package 20 constructed in such a manner, an LED chip (not shown) is disposed so that the light-emission surface thereof is directed toward the lens 90. The lead frame 50 and the LED chip are electrically connected through a wire (not shown).

FIG. 2 is a sectional view taken along I-I' line of FIG. 1, showing the structure of the conventional SMD-type LED in detail.

As shown in FIG. 2, the SMD-type LED includes the lead frame 50 composed of one or more pairs of lead electrodes, the package 20 formed to house a portion of the lead frame 50 therein, the LED chip 60 mounted on the lead frame 50 inside the package 20, the wire 70 for electrically connecting the LED 60 an the lead frame 50, a phosphor-mixed layer 80 filled in the package 20 so as to protect the LED chip 60 and the wire 70 and to determine a color of light emitted from the LED chip 60, and the lens 90 formed on the package 20, the lens 90 coming in contact with the upper surface of the phosphor-mixed layer 80.

General standards for determining characteristics of LED chips include color, luminance, an intensity range of luminance and the like. Such characteristics are primarily determined by materials of compound semiconductors to be used in LED chips, but are incidentally influenced by the structure of a package for mounting an LED chip and a phosphor-mixed layer filled in the package. Particularly, the phosphor-mixed layer filled in the package has a large effect on the distribution of luminance.

However, the phosphor-mixed layer of the conventional SMD-type LED is filled in the entire package having the LED chip mounted therein. Therefore, the phosphor-mixed layer is formed at a relatively-large thickness, depending on the depth of the package.

When the phosphor-mixed layer has a large thickness as described above, the energy of light to be emitted from the LED chip is significantly reduced, while the light passes through the phosphor-mixed layer. As a result, light extraction efficiency decreases.

Further, in the conventional SMD-type LED, the phosphor-mixed layer is filled in the entire package. Therefore, a consumed amount of phosphor is so excessive that a manufacturing cost increases. Accordingly, a production yield decreases.

SUMMARY OF THE INVENTION

An advantage of the present invention is that it provides an SMD-type LED in which a phosphor-mixed layer is reduced in thickness such that the reduction in energy of light passing through the phosphor-mixed layer is minimized. Then, it is possible to enhance overall light extraction efficiency of the LED.

Additional aspect and advantages of the present general inventive concept will be set forth in part in the description which follows and, in part, will be obvious from the description, or may be learned by practice of the general inventive concept.

According to an aspect of the invention, an SMD-type LED comprises a package housing one or more pairs of electrodes therein, the package having a predetermined space in the center thereof and a light-emission window which is opened so that light is emitted through the light-emission window; a lens formed on the package so as to cover the light-emission window; an LED chip formed on an electrode inside the package; a wire for electrically connecting the LED chip and the electrode; and a phosphor-mixed layer formed on the surface of the lens adjacent to the light-emission window.

According to another aspect of the invention, the surface of the lens having the phosphor-mixed layer formed thereon is formed with a groove concave toward the lens with respect to the surface of the light-emission window.

According to a further aspect of the invention, the inner surface of the concave groove can be varied, depending on a characteristic of an SMD-type LED. The concave groove can be formed with a hemispheric surface, an inclined surface which is tapered toward the central portion from both ends of the groove, or an irregular surface.

According to a still further aspect of the invention, the reverse surface of the lens having the phosphor-mixed layer formed thereon is a hemispheric surface convex toward the outside.

According to a still further aspect of the invention, the SMD-type LED further comprises air or liquid resin filled in the package so as to protect the LED chip and the wire.

According to a still further aspect of the invention, the package is formed of molding resin such that a portion of a lead frame composed of one or more pairs of lead electrodes is housed therein.

According to a still further aspect of the invention, the molding resin is transparent or opaque synthetic resin.

According to a still further aspect of the invention, the package is composed of a printed circuit board on which one or more pairs of electrodes are printed.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a schematic view illustrating the structure of a general SMD-type LED;

FIG. 2 is a sectional view taken along I-I' line of FIG. 1;

FIG. 3 is a sectional view of an SMD-type LED according to the a embodiment of the invention;

FIGS. 4 to 7 are sectional views illustrating modifications of a lens according to the first embodiment of the invention; and FIG. 8 is a sectional view illustrating the structure of an SMD-type LED according to a second embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, an SMD-type LED according to embodiments of the present invention will be described in detail with reference to the accompanying drawings.

First Embodiment

Referring to FIG. 3, an SMD-type LED according to a first embodiment of the invention will be described in detail.

FIG. 3 is a sectional view of the SMD-type LED according to the first embodiment of the invention.

Referring to FIG. 3, the SMD-type LED according to the first embodiment of the invention has a package 20 having a cavity formed in the central inner portion thereof. The package 20 has an emission window formed on a predetermined surface thereof such that light is easily emitted through the emission window. On the package 20, a lens 90 is positioned.

The surface of the lens 90, which is adjacent to the emission window, is formed to have a groove which is concave toward the lens 90. The concave groove of the lens 90 serves to define a formation region of a phosphor-mixed layer to be described below.

In this embodiment, it is shown that the concave groove of the lens 90 is formed with a curved surface. Without being limited thereto, however, the concave groove of the lens 90 can be formed to have a variety of shapes, as shown in FIGS. 4 to 7.

FIGS. 4 to 7 are sectional views illustrating modifications of the lens according to the first embodiment of the invention.

More specifically, FIG. 4 shows that the concave groove of the lens 90 is formed with a hemispheric surface. FIG. 5 shows that the concave groove of the lens 90 is formed with an inclined surface which is tapered toward the central portion from both ends of the groove. FIGS. 6 and 7 show that the concave groove of the lens 90 is formed with an irregular surface composed of concave and convex portions such that a plurality of LED chips are positioned inside the package. In the drawings, reference numeral 80 represents a phosphor-mixed layer.

As described above, the various shapes for the inner surface of the lens 90 can adjust a directivity angle of light to be emitted from the LED chip, depending on a characteristic of an LED. Accordingly, it is possible to enhance overall light extraction efficiency of an LED. Particularly, in the lens 90 having the irregular surface shown in FIG. 6 or 7, when a plurality of LED chips are disposed inside the package, a plurality of different directivity angles can be set so as to be correspond to the characteristics of the respective LED chips.

The reverse surface of the lens 90 having the concave groove is a hemispheric surface convex toward the outside.

On the concave groove of the lens 90, that is, on the surface of the lens 90 adjacent to the emission window, the phosphor-mixed layer 80 is formed. The phosphor-mixed layer 80 is formed by a coating method. The phosphor-mixed layer 80 may be formed of an oxide-based phosphor mixture, a silicon-based phosphor mixture, a nitride-based phosphor mixture, or a sulfide-based phosphor mixture.

That is, the phosphor-mixed layer 80 according to the invention is formed on the surface of the lens 90 adjacent to the emission window of the package 20 by a coating method. Therefore, the thickness and concentration of the phosphor-mixed layer 80 can be easily adjusted, compared with the conventional phosphor-mixed layer (refer to FIG. 2) which is filled in the entire package 20. Accordingly, it is possible to implement uniform white light for various color coordinates. Further, the phosphor-mixed layer 80 can be spaced at a uniform distance from the side surface and upper surface of the LED chip 60 positioned in the lower portion, thereby obtaining more uniform color of light to be emitted from the LED chip.

Further, the phosphor-mixed layer 80 is formed on the surface of the lens 90 such that the phosphor-mixed layer 80 and the lens 90 are integrated. Then, the delamination between the package 20 and the lens 90 can be prevented, and bubbles caused by the phosphor-mixed layer 80 can be prevented from being generated in the package 20.

On another surface of the package 20, one or more electrodes, each of which is composed of a pair of electrodes, are formed so as to be mounted on a printed circuit board (not shown). Some of the electrodes are housed inside the package.

More specifically, the package 20 is formed of molding resin such that a portion of a lead frame composed of one or more pairs of lead electrodes can be housed inside the package 20. Alternately, the package 20 can be composed of a printed circuit board on which one or more pairs of electrodes are printed.

In the invention, the package 20 formed of molding resin such that a portion of a lead frame 50 composed of one or more pairs of lead electrodes is housed therein is shown and described as an embodiment. The molding resin of the package 20 may be transparent or opaque synthetic resin.

Inside the package 20 constructed in such a manner, the LED chip 60 is disposed so that the light-emission surface thereof is directed toward the light-emission window. The LED chip 60 is electrically connected to the lead frame 50 through a wire 70 by wire bonding.

The LED chip 60 is mounted on any one of lead electrodes of the lead frame 50. Inside the package 20 having the LED chip 60 mounted therein, air 30 is filled. When the package 20 having the LED chip 60 mounted therein is hollowed, stress to be concentrated on the wire 70 can be minimized, the wire 70 applying a current to the LED chip 60.

Second Embodiment

Next, a second embodiment of the invention will be described with reference to FIG. 8. However, the descriptions of the same components as those of the first embodiment will be omitted.

FIG. 8 is a sectional view illustrating the structure of an SMD-type LED according to the second embodiment of the invention.

As shown in FIG. 8, the SMD-type LED according to the second embodiment has almost the same construction as the SMD-type LED according to the first embodiment. However, the SMD-type LED according to the second embodiment is different from that of the first embodiment only in that liquid resin 40 is filled inside the package 20 having the LED chip 60 mounted therein.

Since the SMD-type LED according to the second embodiment also has the phosphor-mixed layer 80 formed on the surface of the lens 90 adjacent to the light-emission window of the package 20, it is possible to obtain the same operation and effect as the first embodiment. Further, the LED chip 60 and the wire 70 mounted in the package 20 can be protected from conductive impurities and external impact by the liquid resin 40 filled in the package 20, which makes it possible to obtain more excellent effect than in the first embodiment.

The second embodiment can be applied to the modifications according to the first embodiment.

According to the present invention, the phosphor-mixed layer is formed on the surface of the lens adjacent to the light-emission window of the package. The thickness and concentration of the phosphor-mixed layer can be easily adjusted so that uniform white light is implemented.

Further, the lens and the phosphor-mixed layer are integrated so as to be spaced at a uniform distance from the outer surface of the LED chip, that is, the upper and side surface of the LED chip. Therefore, it is possible to obtain uniform color of light.

Further, the reduction in energy of light which is emitted from the LED chip so as to be transmitted through the phosphor-mixed layer can be minimized by the reduced thickness of the phosphor-mixed layer.

Therefore, it is possible to provide an SMD-type LED which can increases a color reproduction rate and enhance light extraction efficiency.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A surface mounting device-type light emitting diode (SMD-type LED) comprising:
    a package housing one or more pairs of electrodes therein, the package having a predetermined space in the center thereof and a light-emission window which is opened so that light is emitted through the light-emission window;
    a lens formed on the package so as to cover the light-emission window;
    an LED chip formed on an electrode inside the package;
    a wire for electrically connecting the LED chip and the electrode; and
    a phosphor-mixed layer formed on the surface of the lens adjacent to the light-emission window;
    wherein the surface of the lens having the phosphor-mixed layer formed thereon is formed with a groove concave toward the lens with respect to the surface of the light-emission window; and
    wherein the concave groove is formed with an inclined surface which is tapered toward the central portion from both ends of the groove.

2. The SMD-type LED according to claim 1, wherein the reverse surface of the lens having the phosphor-mixed layer formed thereon is a hemispheric surface convex toward the outside.

3. The SMD-type LED according to claim 1 further comprising
    air filled in the package so as to protect the LED chip and the wire.

4. The SMD-type LED according to claim 1 further comprising
    liquid resin filled in the package so as to protect the LED chip and the wire.

5. The SMD-type LED according to claim 1, wherein the package is formed of molding resin such that a portion of a lead frame composed of one or more pairs of lead electrodes is housed therein.

6. The SMD-type LED according to claim 5, wherein the molding resin is transparent or opaque synthetic resin.

7. The SMD-type LED according to claim 1, wherein the package is composed of a printed circuit board on which one or more pairs of electrodes are printed.

8. A surface mounting device-type light emitting diode (SMD-type LED) comprising:
    a package housing one or more pairs of electrodes therein, the package having a predetermined space in the center thereof and a light-emission window which is opened so that light is emitted through the light-emission window;
    a lens formed on the package so as to cover the light-emission window;
    an LED chip formed on an electrode inside the package;
    a wire for electrically connecting the LED chip and the electrode; and
    a phosphor-mixed layer formed on the surface of the lens adjacent to the light-emission window;
    wherein the surface of the lens having the phosphor-mixed layer formed thereon is formed with a groove concave toward the lens with respect to the surface of the light-emission window; and
    wherein the concave groove is formed with an irregular surface.

* * * * *